(12) United States Patent
Jung

(10) Patent No.: US 6,417,530 B1
(45) Date of Patent: Jul. 9, 2002

(54) SENSE AMPLIFIER LAYOUT METHOD, AND SEMICONDUCTOR MEMORY DEVICE USING THE SAME

(75) Inventor: Seung Ho Jung, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/012,528

(22) Filed: Dec. 12, 2001

(30) Foreign Application Priority Data

May 10, 2001 (KR) .............................. 01-25524

(51) Int. Cl.[7] .............................................. H01L 27/10
(52) U.S. Cl. ...................... 257/202; 257/206; 257/903
(58) Field of Search ............................ 365/51, 63, 205, 365/206, 207, 208; 257/202, 206, 207, 208, 369, 903, 904

(56) References Cited

U.S. PATENT DOCUMENTS

| | | | | |
|---|---|---|---|---|
| 4,825,417 A | * | 4/1989 | Seo | 327/565 |
| 4,958,325 A | * | 9/1990 | Nakagome et al. | 365/206 |
| 5,644,525 A | | 7/1997 | Takashima et al. | |
| 5,774,408 A | | 6/1998 | Shirley | |
| 5,965,922 A | * | 10/1999 | Matsui | 257/369 |
| 6,175,138 B1 | * | 1/2001 | Noda | 257/391 |
| 6,340,825 B1 | * | 1/2002 | Shibata et al. | 257/207 |

FOREIGN PATENT DOCUMENTS

| | | |
|---|---|---|
| JP | A7-249694 | 9/1995 |
| JP | A10-116651 | 5/1998 |
| JP | 200-22108 A | 1/2000 |
| JP | 2000-124415 A | 4/2000 |

* cited by examiner

Primary Examiner—Olik Chaudhuri
Assistant Examiner—Hoai Pham
(74) Attorney, Agent, or Firm—Birch, Stewart, Kolasch & Birch, LLP

(57) ABSTRACT

In the sense amplifier layout method of a semiconductor memory device, a plurality of bit lines and bit bar lines are alternately aligned in parallel. One bit line and one bit bar line form a bit line pair. A plurality of MOS transistors for a sense amplifier extend over a predetermined number of bit line pairs in a longitudinal direction of the bit line pairs. Gates of the MOS transistors are formed over at least a portion the predetermined number of bit line pairs.

18 Claims, 5 Drawing Sheets

SENSE AMPLIFIER LAYOUT METHOD, AND SEMICONDUCTOR MEMORY DEVICE USING THE SAME

BACKGROUND OF THE INVENTION

1. Field of the Invention

The present invention relates to a sense amplifier layout method of a semiconductor memory device, and in particular to a layout structure of NMOS transistors of a sense amplifier.

2. Description of the Background Art

A sense amplifier of a semiconductor memory device consists of a pull-up device using a PMOS transistor and a pull-down device using an NMOS transistor. The sense amplifier amplifies a data voltage applied to a bit line BL and a bit bar line /BL, and outputs the amplified voltage to a data bus.

FIG. 1 illustrates the sense amplifier of the semiconductor memory device. Referring to FIG. 1, the sense amplifier includes: a first sense amp unit 10 for sensing data of a bit bar line /BL0 and a bit line BL0; and a second sense amp unit 20 for sensing data of a bit bar line /BL1 and a bit line BL1. In the first sense amp unit 10, a PMOS transistor P1 and an NMOS transistor N1 are connected in series between a power supply voltage VDD and a ground VSS, and a PMOS transistor P2 and an NMOS transistor N2 are connected in series between the power supply voltage VDD and the ground VSS. The PMOS transistor P1 and the NMOS transistor N1 have their drains connected to the bit bar line /BL0 and their gates connected to the bit line BL0. In addition, the PMOS transistor P2 and the NMOS transistor N2 have their drains connected to the bit line BL0 and their gates connected to the bit bar line /BL0.

In the second sense amp unit 20, a PMOS transistor P3 and an NMOS transistor N3 are connected in series between the power supply voltage VDD and the ground VSS, and a PMOS transistor P4 and an NMOS transistor N4 are connected in series between the power supply voltage VDD and the ground VSS. The PMOS transistor P3 and the NMOS transistor N3 have their drains connected to the bit bar line /BL1 and their gates connected to the bit line BL1. In addition, the PMOS transistor P4 and the NMOS transistor N4 have their drains connected to the bit line BL1 and their gates connected to the bit bar line /BL1.

At an initial stage of the operation, the bit line BL0, the bit bar line /BL0, the bit line BL1 and the bit bar line /BL1 are precharged with half a power supply voltage ½ VDD, which is maintained as it is or slightly increased due to a voltage level of a data signal from a memory cell. A voltage increase ratio of the bit lines due to the voltage of the data signal is very small because of operation speed and size of the capacitor. Accordingly, the sense amplifier of the semiconductor memory device requires high sensitivity.

FIG. 2A is a layout diagram illustrating a conventional NMOS transistor unit of the first and second sense amp units 10, 20. As illustrated in FIG. 2A, the bit line BL0, the bit bar line /BL0, the bit line BL1 and the bit bar line /BL1 are formed in parallel in a longitudinal direction at predetermined intervals. The NMOS transistor (N1) 40 of the first sense amp unit 10 is formed at the upper portion of the bit line BL0 and the bit bar line /BL0, and the NMOS transistor (N2) 42 of the first sense amp unit 10 is formed at the lower portion thereof. The NMOS transistor (N4) 44 of the second sense amp unit 20 is formed at the upper portion of the bit line BL1 and the bit bar line /BL1, and the NMOS transistor (N3) 46 of the second sense amp unit 20 is formed at the lower portion thereof.

On the other hand, the ground line VSS is vertically formed at the left portion of the bit line BL0 in the NMOS transistor region 40 of the first sense amp unit 10, vertically formed at the right portion of the bit bar line /BL1 in the NMOS transistor region 44 of the second sense amp unit 20, and formed between the bit bar line /BL0 and the bit line BL1.

In the NMOS transistor region 40 of the first sense amp unit 10, a first gate contact G1 is formed on the bit line BL0, a first drain contact D1 is formed on the bit bar line /BL0, and a first source contact S1 is formed on the ground line VSS vertically formed at the left portion of the bit line BL0. In the NMOS transistor region 42 of the first sense amp unit 10, a second drain contact D2 is formed on the bit line BL0, a second gate contact G2 is formed on the bit bar line /BL0, and a second source contact S2 is formed on the ground line VSS vertically formed between the bit line BL0 and the bit bar line /BL0.

In the NMOS transistor region 44 of the second sense amp unit 20, a third drain contact D3 is formed on the bit line BL1, a third gate contact G3 is formed on the bit bar line /BL1, and a third source contact S3 is formed on the ground line VSS vertically formed at the right portion of the bit bar line /BL1. In the NMOS transistor region 46 of the second sense amp unit 20, a fourth gate contact G4 is formed on the bit line BL1, a fourth drain contact D4 is formed on the bit bar line /BL1, and a fourth source contact S4 is formed on the ground line VSS vertically formed between the bit line BL0 and the bit bar line /BL0.

FIG. 2B is a cross-sectional diagram taken along line II—II of FIG. 2A. As shown in FIG. 2B, a p-type active region 52 is formed on a silicon wafer 51, and three n+ impurity regions 53, 54, 55 are formed in the active region 52. On the active region 52, a first gate 56 (electrode over gate insulator) is formed between the first impurity region 53 and the second impurity region 54, and a second gate 57 is formed between the second impurity region 54 and the third impurity region 55. An interlayer insulating film 58 is formed over the resultant structure having the first and second gates 56, 57. Contact holes (not shown) are formed to partially expose the first to third impurity regions 53, 54, 55. A conductive material formed over the resultant structure including the contact holes is partially patterned to form first to third conducting lines 59, 60, 61. The second drain contact D2 is formed between the conducting line 59 and the region 53. The second source contact S2 and the fourth source contact S4 are formed between the conducting line 60 and the region 54. And the fourth drain contact D4 is formed between the conducting line 61 and the region 55.

In the conventional sense amplifier layout method, as illustrated in FIG. 2A, the upper and lower portions of one bit line pitch L respectively have one NMOS transistor. Accordingly, one NMOS transistor is provided in one sense amp pitch L. As further shown in FIGS. 2A and 2B, the drain and source contacts of each NMOS transistor lie in a line (e.g., line II—II) perpendicular to the longitudinal direction of the bit and bit bar lines. As extra material is needed when making a contact, the NMOS transistors extend beyond the sense amp pitch L, thereby increasing a layout area of the sense amplifier and decreasing a process margin. Moreover, a gate interconnection is used due to a deficient interconnection area, and thus the sense amplifier is influenced by a gate interconnection resistance, which reduces an operation speed or causes a mis-operation.

SUMMARY OF THE INVENTION

Therefore, it is an object of the present invention to provide a sense amplifier layout method of a semiconductor memory device which can decrease a layout area of a sense amplifier and increase a process margin.

Another object of the present invention is to provide a sense amplifier layout method of a semiconductor memory device which can increase an interconnection area, without requiring a gate interconnection.

In order to achieve the above-described objects of the present invention, there is provided an improved sense amplifier layout method of a semiconductor memory device. Firstly, a plurality of bit lines and bit bar lines are alternately aligned in parallel. One bit line and one bit bar line form a bit line pair. Only one MOS transistor for configuring a sense amplifier is disposed over a predetermined number of bit line pairs in the width direction, and a predetermined number of the MOS transistors are disposed over the bit line pairs in the longitudinal direction. The gates of the MOS transistors are formed over at least a portion of the plurality of bit line pairs in the width direction. Preferably, the gates of the MOS transistors are formed in a ring or rectangle shape.

Especially, the MOS transistors are extended over the two bit line pairs. The two bit line pairs include a first bit line, a first bit bar line, a second bit line and a second bit bar line. The first to fourth MOS transistors are aligned on the two bit line pairs in the longitudinal direction. The first and second MOS transistors compose one cross-coupled MOS, and the third and fourth MOS transistors compose the other cross-coupled MOS.

In the first MOS transistor, a first gate contact is formed on the first bit line, a first drain contact is formed on the first bit bar line, and a first source contact is formed on a ground line formed between the first bit line and the first bit bar line. In the second MOS transistor, a second drain contact is formed on the first bit line, a second gate contact is formed on the first bit bar line, and a second source contact is formed on the ground line formed between the first bit line and the first bit bar line. In the third MOS transistor, a third gate contact is formed on the second bit line, a third drain contact is formed on the second bit bar line, and a third source contact is formed on a ground line formed between the second bit line and the second bit bar line. In the fourth MOS transistor, a fourth drain contact is formed on the second bit line, a fourth gate contact is formed on the second bit bar line, and a fourth source contact is formed on the ground line formed between the second bit line and the second bit bar line.

According to the above-mentioned configuration, only one NMOS transistor is arranged on two bit line pitches (2L), thereby reducing a layout area of the sense amplifier and increasing a process margin. In addition, an interconnection area is increased by aligning one NMOS transistor at the upper and lower portions of the two bit line pitches (2L), and thus a gate interconnection is not required. It is therefore possible to improve an unstable operation of the sense amplifier resulting from a gate interconnection resistance.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
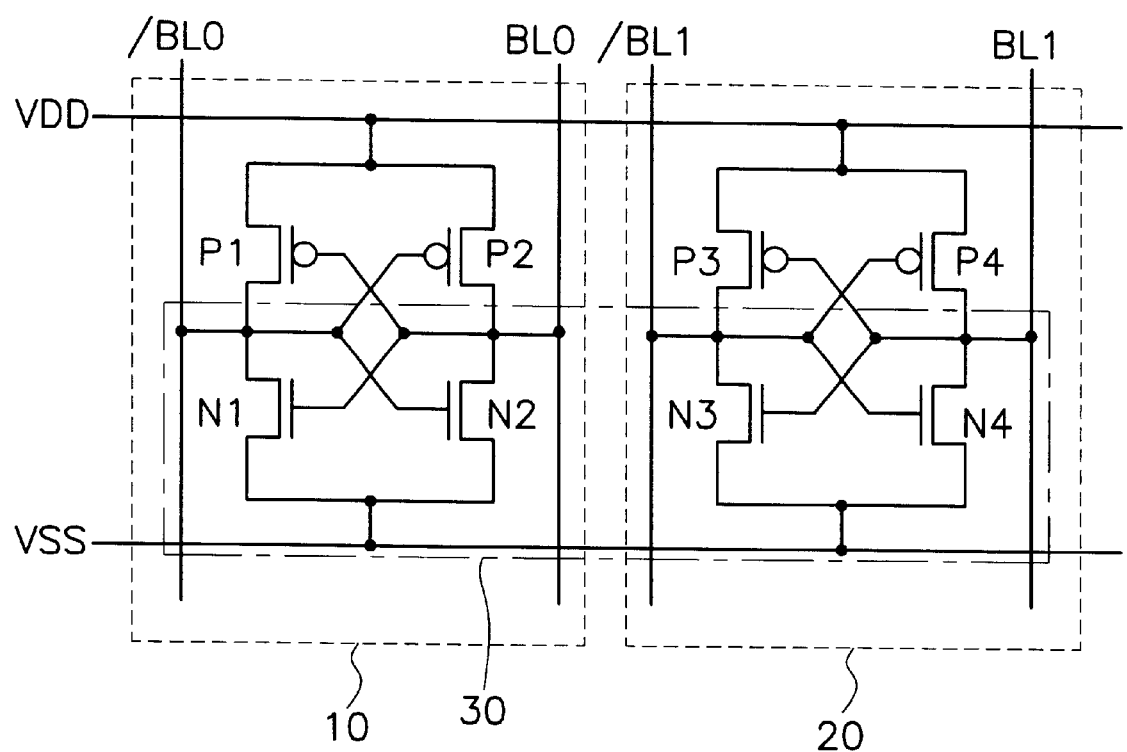
FIG. 1 is a circuit diagram illustrating a conventional sense amp structure of a semiconductor memory device.

A sense amplifier layout method and a semiconductor memory device using the same in accordance with a preferred embodiment of the present invention will now be described in detail with reference to the accompanying drawings. In the following description, same drawing reference numerals are used for the same elements even in different drawings, and detailed explanations thereof are omitted.

Figure 2A:
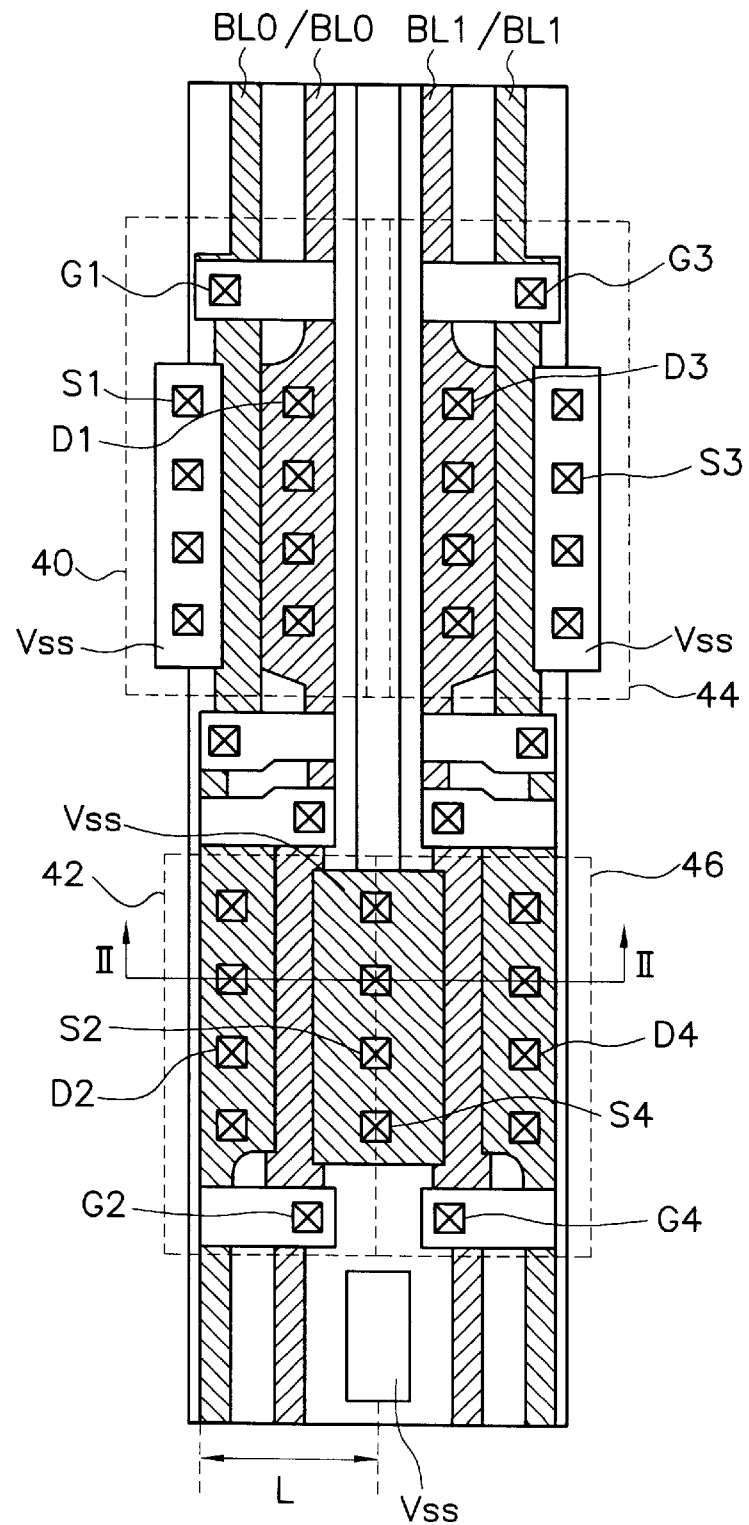
FIG. 2A is a layout diagram illustrating a conventional NMOS transistor unit of a sense amplifier of FIG. 1.
Figure 2B:
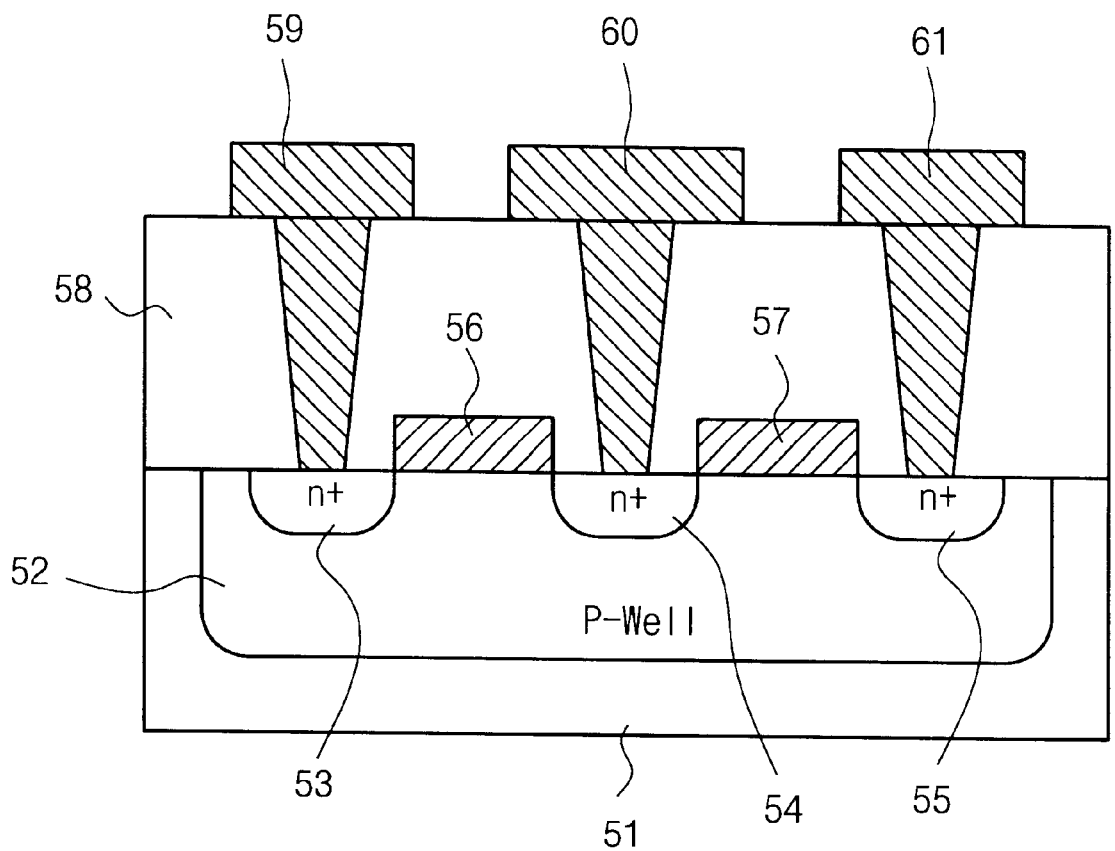
FIG. 2B is a cross-sectional diagram taken along line II—II of FIG. 2A.
Figure 3A:
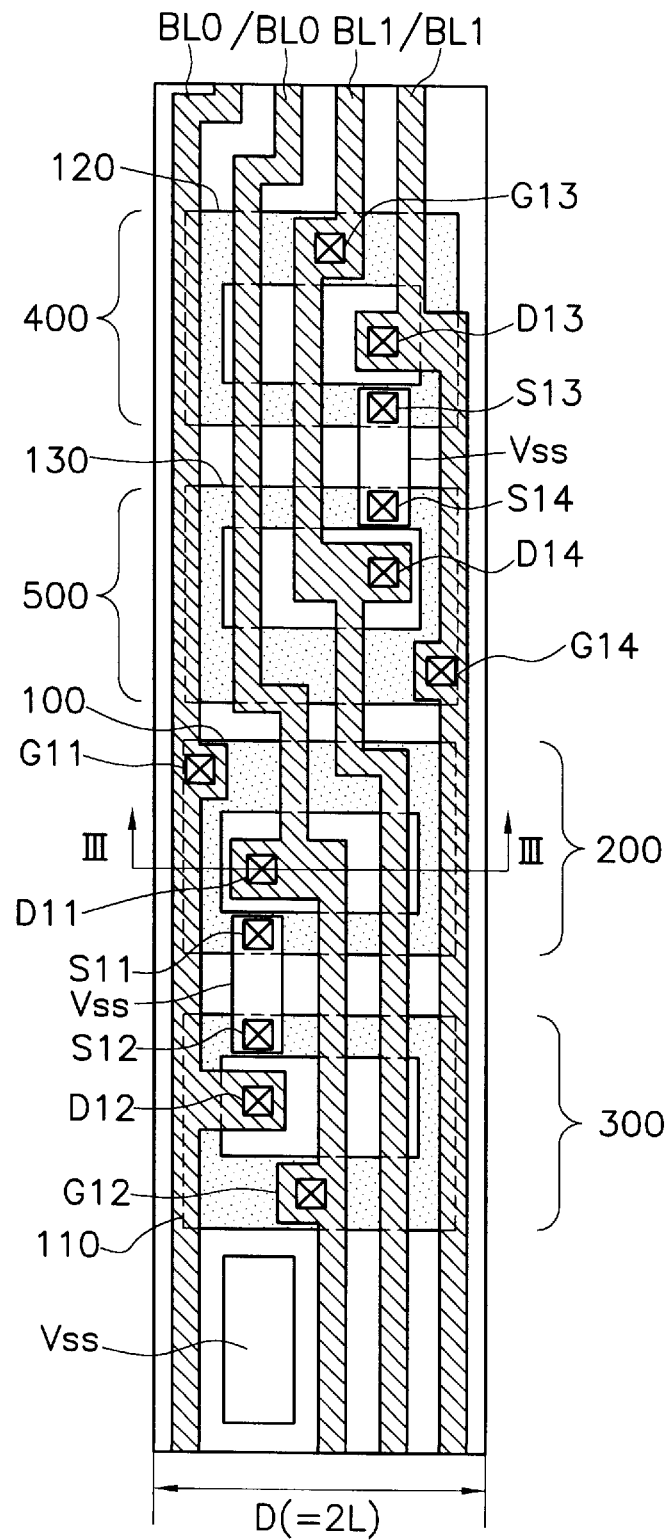
FIG. 3A is a layout diagram illustrating the NMOS transistor unit of the sense amplifier of FIG. 1 in accordance with the present invention.

FIG. 3A is a layout diagram illustrating an NMOS transistor unit of a sense amplifier of FIG. 1 in accordance with the present invention. Referring to FIG. 3A, a bit line BL0, a bit bar line /BL0, a bit line BL1 and a bit bar line /BL1 are formed in parallel in a longitudinal direction at predetermined intervals. Here, when it is presumed that a lateral (or width direction) length of the bit line BL0, the bit bar line /BL0, the bit line BL1 and the bit bar line /BL1, namely the two bit line pairs is 'D', D is twice as long as a bit line pitch L of FIG. 2A. Also, the bit and bit bar lines BL0, /BL0, BL1 and /BL1 have a staggered step structure to provide space for forming the source and drain contacts (described below) for the NMOS transistors (also described below).

The NMOS transistor N3 of a second sense amp unit 20 of FIG. 1 is aligned at the upper portions of the bit line BL0, the bit bar line /BL0, the bit line BL1 and the bit bar line /BL1 having the pitch D (400), and an NMOS transistor N4 of the second sense amp unit 20 is aligned at the lower portions thereof (500). An NMOS transistor N1 of a first sense amp unit 10 is positioned below the region where the NMOS transistor N4 is aligned (200), and an NMOS transistor N2 of the first sense amp unit 10 is positioned there below (300). The NMOS transistors N1, N2, N3, N4 of the first and second sense amp units 10, 20 have one ring-shaped gate, respectively. The two pairs of two gates are aligned at the upper and lower portions of the bit line BL0, the bit bar line /BL0, the bit line BL1 and the bit bar line /BL1.

The sense amplifier layout structure in accordance with the present invention will now be explained in detail with reference to FIG. 3A. In the NMOS transistor region 400 of the second sense amp unit 20, a gate contact G13 is formed on the bit line BL1, a drain contact D13 is formed on the bit bar line /BL1, and a source contact S13 is formed on a ground line VSS vertically formed between the bit line BL1 and the bit bar line /BL1. The gate 120 of the NMOS transistor N3 connected to the bit line BL1 is formed in a rectangle or ring shape on the whole upper portion of the bit line BL0, the bit bar line /BL0, the bit line BL1 and the bit bar line /BL1. In the NMOS transistor region 500 of the second sense amp unit 20, a drain contact D14 is formed on the bit line BL1, a gate contact G14 is formed on the bit bar line /BL1, and a source contact S14 is formed on the ground line VSS vertically formed between the bit line BL1 and the bit bar line /BL1. The gate 130 of the NMOS transistor N4 connected to the bit bar line /BL1 is formed in a rectangle or ring shape on the whole upper portion of the bit line BL0, the bit bar line /BL0, the bit line BL1 and the bit bar line /BL1.

In the NMOS transistor region 200 of the first sense amp unit 20, a gate contact G11 is formed on the bit line BL0, a drain contact D11 is formed on the bit bar line /BL0, and a source contact S11 is formed on the ground line VSS vertically formed between the bit line BL0 and the bit bar line /BL0. The gate 100 of the NMOS transistor N1 connected to the bit line BL0 is formed in a rectangle or ring shape on the whole upper portion of the bit line BL0, the bit bar line /BL0, the bit line BL1 and the bit bar line /BL1. In the NMOS transistor region 300 of the first sense amp unit 10, a drain contact D12 is formed on the bit line BL0, a gate contact G12 is formed on the bit bar line /BL0, and a source contact S12 is formed on the ground line VSS vertically formed between the bit line BL0 and the bit bar line /BL0. The gate 110 of the NMOS transistor N2 connected to the bit line BL0 is formed in a rectangle or ring shape on the whole upper portion of the bit line BL0, the bit bar line /BL0, the bit line BL1 and the bit bar line /BL1. Here, the respective ring-shaped gates 100, 110, 120, 130 composing the NMOS transistors N1, N2, N3, N4 of the first and second sense amp units 10, 20 are designed to share drains and gates.

Unlike the conventional art, the source and drain of each NMOS transistor are not arranged in a line (e.g., line III—III), perpendicular to a longitudinal direction of the bit and bit bar lines. Instead, the source and drain of each NMOS transistor lies along a line in the longitudinal direction of the bit and bit bar lines. As described above, this is made possible in part by the staggered step structure of the bit and bit bar lines as shown in FIG. 3A.

Figure 3B:
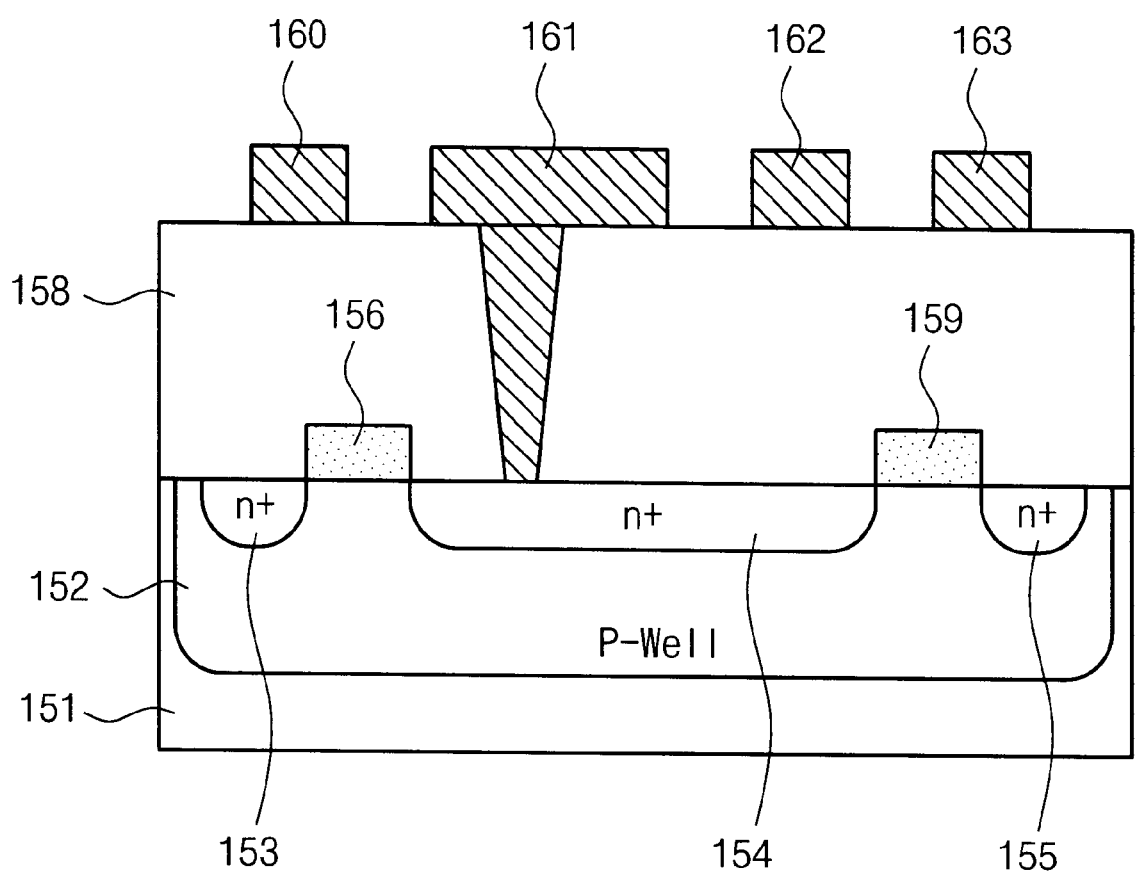
FIG. 3B is a cross-sectional diagram taken along line III—III of FIG. 3A.

FIG. 3B is a cross-sectional diagram taken along line III—III of FIG. 3A. As shown in FIG. 3B, a p-type active region 152 is formed on a silicon wafer 151, and three n+ impurity regions 153, 154, 155 are formed in the active region 152. On the active region 152, a first gate 156 (electrode over gate insulator) is formed between the first impurity region 153 and the second impurity region 154, and a second gate 157 is formed between the second impurity region 154 and the third impurity region 155. An interlayer insulating film 158 is formed over the resultant structure having the first and second gates 156, 157. A contact hole (not shown) is formed to partially expose the second impurity region 154. A conductive material formed over the resultant structure including the contact hole is partially patterned to form two bit line pairs 160, 161, 162 and 163 (BL0, /BL0, BL1 and /BL1 of FIG. 3A, respectively).

As discussed earlier, as compared with the conventional sense amplifier layout structure having one NMOS transistor in one bit line pitch, the present invention embodies one NMOS transistor in the two bit line pitches (2L), thereby reducing a layout area of the sense amplifier and increasing a process margin. In addition, an interconnection area is increased by aligning one NMOS transistor at the upper and lower portions of the two bit line pitches (2L), and thus a gate interconnection is not required. It is therefore possible to improve an unstable operation of the sense amplifier resulting from a gate interconnection resistance.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are intended to be embraced by the appended claims. The above-described embodiment of the present invention relates mostly to the sense amplifier layout method of the semiconductor memory device, but the semiconductor memory device using the same is also included in the scope of the present invention.

What is claimed is:

1. A layout method of sense amplifiers in a semiconductor memory device, comprising the steps of:

alternately aligning a plurality of bit lines and bit bar lines in parallel, one bit line and one bit bar line forming one bit line pair; and arranging a predetermined number of MOS transistors for configuring the sense amplifiers over a predetermined number of bit line pairs, the MOS transistors arranged in a longitudinal direction of the bit lines and bit bar lines, only one MOS transistor extending over the predetermined number of bit line pairs in a width direction of the bit lines and bit bar lines, and a gate of each MOS transistor being formed over at least a portion of the bit lines and the bit bar lines in the predetermined number of bit line pairs.

2. The method according to claim 1, wherein the gates of the MOS transistors for the sense amplifier have one of a ring and a rectangle shape.

3. The method according to claim 1, wherein the MOS transistors are NMOS transistors.

4. The method according to claim 1, wherein first to fourth MOS transistors extend over two bit line pairs including a first bit line, a first bit bar line, a second bit line and a second bit bar line, the first to fourth MOS transistors are aligned on the two bit line pairs in the longitudinal direction, the first and second MOS transistors form one cross-coupled MOS, and the third and fourth MOS transistors form another cross-coupled MOS.

5. The method according to claim 4, wherein:

in the first MOS transistor, a first gate contact is formed on the first bit line, a first drain contact is formed on the first bit bar line, and a first source contact is formed on a ground line formed between the first bit line and the first bit bar line;

in the second MOS transistor, a second drain contact is formed on the first bit line, a second gate contact is formed on the first bit bar line, and a second source contact is formed on the ground line formed between the first bit line and the first bit bar line;

in the third MOS transistor, a third gate contact is formed on the second bit line, a third drain contact is formed on the second bit bar line, and a third source contact is formed on a ground line formed between the second bit line and the second bit bar line; and in the fourth MOS transistor, a fourth drain contact is formed on the second bit line, a fourth gate contact is formed on the second bit bar line, and a fourth source contact is formed on the ground line vertically formed between the second bit line and the second bit bar line.

6. The method according to claim 1, wherein source and drain contact for each of the MOS transistors do not lie on a line substantially perpendicular to the longitudinal direction.

7. The method according to claim 1, wherein source and drain contacts for each of the MOS transistors lie on a line in the longitudinal direction.

8. A semiconductor memory device with sense amplifiers comprising:
- a plurality of bit lines and bit bar lines alternately aligned in parallel, one bit line and one bit bar line forming one bit line pair; and
- a predetermined number of MOS transistors disposed over the bit line pairs in a longitudinal direction of the bit lines and bit bar lines, each MOS transistor extending over a predetermined number of bit line pairs in a width direction, and a gate of each MOS transistor being formed over at least a portion of the bit lines and the bit bar lines in the predetermined number of bit line pairs.

9. The device according to claim 8, wherein the gates of the MOS transistors for the sense amplifier have one of a ring and rectangle shape.

10. The device according to claim 8, wherein the MOS transistors are NMOS transistors.

11. The device according to claim 8, wherein first to fourth MOS transistors extend over two bit line pairs including a first bit line, a first bit bar line, a second bit line and a second bit bar line, the first to fourth MOS transistors are aligned on the two bit line pairs in the longitudinal direction, the first and second MOS transistors form one cross-coupled MOS, and the third and fourth MOS transistors form another cross-coupled MOS.

12. The device according to claim 11, wherein:
- in the first MOS transistor, a first gate contact is formed on the first bit line, a first drain contact is formed on the first bit bar line, and a first source contact is formed on a ground line formed between the first bit line and the first bit bar line;
- in the second MOS transistor, a second drain contact is formed on the first bit line, a second gate contact is formed on the first bit bar line, and a second source contact is formed on the ground line formed between the first bit line and the first bit bar line;
- in the third MOS transistor, a third gate contact is formed on the second bit line, a third drain contact is formed on the second bit bar line, and a third source contact is formed on a ground line formed between the second bit line and the second bit bar line; and
- in the fourth MOS transistor, a fourth drain contact is formed on the second bit line, a fourth gate contact is formed on the second bit bar line, and a fourth source contact is formed on the ground line vertically formed between the second bit line and the second bit bar line.

13. The device according to claim 8, wherein source and drain contacts for each of the MOS transistors do not lie on a line substantially perpendicular to the longitudinal direction.

14. The device according to claim 8, wherein source and drain contacts for each of the MOS transistors lie on a line in the longitudinal direction.

15. A semiconductor memory device with a sense amplifier, comprising:
- a plurality of bit lines and bit bar lines alternately aligned in parallel, one bit line and one bit bar line forming one bit line pair;
- first to fourth MOS transistors for the sense amplifier aligned in a longitudinal direction of two bit line pairs including a first bit line, a first bit bar line, a second bit line and a second bit bar line, and gates of the first to fourth MOS transistors being formed over at least a portion of the two bit line pairs;
- the first and second MOS transistors forming one cross-coupled MOS, and the third and fourth MOS transistors form another cross-coupled MOS;
- the first MOS transistor having a first gate contact on the first bit line, a first drain contact on the first bit bar line, and a first source contact on a ground line formed between the first bit line and the first bit bar line;
- the second MOS transistor having a second drain contact on the first bit line, a second gate contact on the first bit bar line, and a second source contact on the ground line formed between the first bit line and the first bit bar line;
- the third MOS transistor having a third gate contact on the second bit line, a third drain contact on the second bit bar line, and a third source contact on a ground line formed between the second bit line and the second bit bar line; and
- the fourth MOS transistor having a fourth drain contact on the second bit line, a fourth gate contact on the second bit bar line, and a fourth source contact on the ground line formed between the second bit line and the second bit bar line.

16. The device according to claim 15, wherein the gates of the first to fourth MOS transistors for the sense amplifier have one of a ring and rectangle shape.

17. The device according to claim 15, wherein source and drain contacts for each of the first to fourth MOS transistors do not lie on a line substantially perpendicular to the longitudinal direction.

18. The device according to claim 15, wherein source and drain contacts for each of the first to fourth MOS transistors lie on a line in the longitudinal direction.

* * * * *